US010884075B2

United States Patent
Xu et al.

(10) Patent No.: US 10,884,075 B2
(45) Date of Patent: Jan. 5, 2021

(54) PRINTED CIRCUIT BOARD, METHOD FOR DETERMINING ENGAGEMENT STATE BETWEEN PRINTED CIRCUIT BOARD AND FLEXIBLE PRINTED CIRCUIT AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bing Xu, Beijing (CN); Tao Hou, Beijing (CN); Junping Bao, Beijing (CN); Xinghua Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 16/329,780

(22) PCT Filed: Aug. 1, 2018

(86) PCT No.: PCT/CN2018/098167
§ 371 (c)(1),
(2) Date: Mar. 1, 2019

(87) PCT Pub. No.: WO2019/056864
PCT Pub. Date: Mar. 28, 2019

(65) Prior Publication Data
US 2019/0257874 A1    Aug. 22, 2019

(30) Foreign Application Priority Data
Sep. 21, 2017    (CN) .......................... 2017 1 0860487

(51) Int. Cl.
*G01R 31/70* (2020.01)
*H01R 12/62* (2011.01)
(Continued)

(52) U.S. Cl.
CPC .............. *G01R 31/70* (2020.01); *G01R 31/66* (2020.01); *H01R 12/62* (2013.01); *H05K 1/118* (2013.01); *H05K 1/14* (2013.01)

(58) Field of Classification Search
CPC ..... G01R 27/2605; G01R 15/16; G06F 3/044; G06F 2203/04103; G06F 3/0416;
(Continued)

(56) References Cited

U.S. PATENT DOCUMENTS 6,774,639 B1 *    8/2004    Unsworth ........... G01R 31/1227
                                                                324/547
7,532,012 B2 *    5/2009    Cern .................. G01R 31/1272
                                                                324/536
(Continued)

FOREIGN PATENT DOCUMENTS

CN        101078745 A      11/2007
CN        101102361 A      1/2008
(Continued)

OTHER PUBLICATIONS

Office Action for corresponding Chinese Application 201710860487.4 dated Feb. 28, 2019.
(Continued)

*Primary Examiner* — Giovanni Astacio-Oquendo
(74) *Attorney, Agent, or Firm* — Arent Fox LLP; Michael Fainberg

(57) ABSTRACT

A printed circuit board, a method for determining an engagement state between the printed circuit board and a flexible printed circuit, and a display device are provided. The printed circuit board includes a substrate, a connector fixed
(Continued)

on the substrate, and configured to be connected with the flexible printed circuit, and a determining circuit connected with the connector. The secondary pin is added to the connector, and can determine together with the determining circuit, added to the substrate, connected with the secondary pin, an engagement state between the first pins of the connector, and the second pins of the flexible printed circuit.

14 Claims, 7 Drawing Sheets

(51) Int. Cl.
*H05K 1/11* (2006.01)
*H05K 1/14* (2006.01)
*G01R 31/66* (2020.01)

(58) Field of Classification Search
CPC .............. G06F 3/03547; H03K 17/955; H03K 17/962; H03K 2217/960705
USPC ........................................ 324/658, 686, 661

See application file for complete search history.

(56) References Cited

U.S. PATENT DOCUMENTS

| | | | | |
|---|---|---|---|---|
| 7,676,333 | B2* | 3/2010 | Younsi | G01R 31/1227 324/458 |
| 8,264,235 | B2* | 9/2012 | De Vries | H01L 22/34 324/525 |
| 2008/0232181 | A1* | 9/2008 | Higashi | G11C 7/1069 365/201 |
| 2012/0068720 | A1 | 3/2012 | Ma et al. | |
| 2017/0059645 | A1* | 3/2017 | Pan | G11C 29/50008 |

FOREIGN PATENT DOCUMENTS

| | | |
|---|---|---|
| CN | 201654067 U | 11/2010 |
| CN | 102411528 A | 4/2012 |
| CN | 205539302 U | 8/2016 |
| CN | 205960250 U | 2/2017 |
| CN | 107677926 A | 2/2018 |
| CN | 207150964 U | 3/2018 |

OTHER PUBLICATIONS

International Search Report for PCT/CN2018/098167 dated Nov. 8, 2018.
Office Action for corresponding Chinese Application 201710860487.4 dated May 24, 2019.

* cited by examiner

PRINTED CIRCUIT BOARD, METHOD FOR DETERMINING ENGAGEMENT STATE BETWEEN PRINTED CIRCUIT BOARD AND FLEXIBLE PRINTED CIRCUIT AND DISPLAY DEVICE

CROSS-REFERENCES TO RELATED APPLICATIONS

This disclosure is a US National Stage of International Application No. PCT/CN2018/098167, filed Aug. 1, 2018, which claims priority to Chinese Patent Application No. 201710860487.4, filed with the Chinese Patent Office on Sep. 21, 2017, and entitled "Printed circuit board, and Method for determining engagement state between printed circuit board and flexible printed circuit".

FIELD

This disclosure relates to the field of display technologies, and particularly to a printed circuit board, and a method for determining engagement state between the printed circuit board and a flexible printed circuit.

BACKGROUND

As the telecommunication technologies are advancing rapidly, various electronic devices have been gradually popularized in our life. A Printed Circuit Board (PCB) and a Flexible Printed Circuit (FPC) for supporting an electronic device are configured to enable various elements in the electronic device to be electrically connected. As the structures and types of the electronic devices in the market become diversified and sophisticated, the printed circuit board and the flexible printed circuit become increasingly important.

When the printed circuit board is connected with the flexible printed circuit, short-circuiting or another abnormal condition may tend to occur, and at this time, when the electronic device is powered on, then large current may result in overburning of a line, or another abnormality, so the product may be wasted.

SUMMARY

An embodiment of this disclosure provides a printed circuit board. The printed circuit board includes a substrate; a connector fixed on the substrate, and configured to be connected with a flexible printed circuit, wherein the connector includes a plurality of first pins and at least one secondary pin, and the first pins are separate from the secondary pin; the first pins are configured to be engaged correspondingly with a plurality of second pins of the flexible printed circuit; the secondary pin is located in an extension direction of the first pin on a side of the first pin engaged in correspondence with the second pin; and a determining circuit connected with the secondary pin, wherein the determining circuit is configured to determine together with the secondary pin an engagement state between the first pins and the second pins.

In a possible implementation, in the printed circuit board above according to the embodiment of this disclosure, the determining circuit is configured to determine a normal engagement state between the first pins and the second pins upon determining that the first pin is connected with the secondary pin in the extension direction of said first pin when the first pins are engaged with the second pins; and to determine an abnormal engagement state between the first pins and the second pins upon determining that the first pin is disconnected from the secondary pin in the extension direction of said first pin when the first pins are engaged with the second pins.

In a possible implementation, in the printed circuit board above according to the embodiment of this disclosure, the determining circuit includes at least one determining sub-circuit connected in a one-to-one manner with the at least one secondary pin, and each determining sub-circuit includes a transistor, a resistor, a detecting circuit, and a judging circuit, wherein the transistor has a gate connected with a backlight wire of the substrate, a drain connected with a detection node, and a source connected with another wire on the substrate than the backlight wire; the resistor has one terminal connected with the detection node, and the other terminal connected with a corresponding secondary pin; the detecting circuit is configured to detect a current or a voltage at the detection node, and to feed a detection result back to the judging circuit; and the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

In a possible implementation, in the printed circuit board above according to the embodiment of this disclosure, the determining circuit includes at least one determining sub-circuit connected in a one-to-one manner with the at least one secondary pin, and each determining sub-circuit includes a transistor, a resistor, a detecting circuit, and a judging circuit, wherein the transistor has a gate connected with a backlight wire of the substrate, a drain connected with a corresponding secondary pin, and a source connected with a detection node; the resistor has one terminal connected with the detection node, and the other terminal connected with another wire on the substrate than the backlight wire; the detecting circuit is configured to detect a current or a voltage at the detection node, and to feed a detection result back to the judging circuit; and the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

In a possible implementation, in the printed circuit board above according to the embodiment of this disclosure, the determining circuit is connected with a plurality of secondary pins, and the determining circuit includes a transistor, a detecting circuit, a judging circuit, and a plurality of resistors corresponding one-to-one to the secondary pins, wherein the transistor has a gate connected with a backlight wire of the substrate, a drain connected with a detection node, and a source connected with another wire on the substrate than the backlight wire; each resistor has one terminal connected with the detection node, and the other terminal connected with a corresponding secondary pin; the detecting circuit is configured to detect a current or a voltage at the detection node, and to feed a detection result back to the judging circuit; and the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

In a possible implementation, in the printed circuit board above according to the embodiment of this disclosure, the at least one secondary pin includes a first secondary pin and a second secondary pin, wherein the first secondary pin is located in the extension direction of the first pin on one side edge of the connector, and the second secondary pin is located in the extension direction of the first pin on the opposite side edge of the connector.

An embodiment of this disclosure further provides a method for determining engagement state between the printed circuit board and a flexible printed circuit. The method includes: engaging the plurality of first pins of the connector on the substrate of the printed circuit board with the plurality of the second pins of the flexible printed circuit; and determining, by the at least one secondary pin, of the connector, located in the extension direction of the first pin, and the determining circuit, on the substrate, connected with the secondary pin, the engagement state between the first pins and the second pins.

In a possible implementation, in the determining method above according to the embodiment of this disclosure, the determining, by the at least one secondary pin, of the connector, located in the extension direction of the first pin, and the determining circuit, on the substrate, connected with the secondary pin, the engagement state between the first pins and the second pins includes: determining, by the determining circuit, a normal engagement state between the first pins and the second pins upon determining that the first pin is connected with the secondary pin in the extension of said first pin when the first pins are engaged with the second pins; and determining an abnormal engagement state between the first pins and the second pins upon determining that the first pin is disconnected from the secondary pin in the extension of said first pin when the first pins are engaged with the second pins.

In a possible implementation, in the determining method above according to the embodiment of this disclosure, the determining circuit includes at least one determining sub-circuit connected in a one-to-one manner with the at least one secondary pin, and each determining sub-circuit includes a transistor, a resistor, a detecting circuit, and a judging circuit; and the determining, by the at least one secondary pin, of the connector, located in the extension direction of the first pin, and the determining circuit, on the substrate, connected with the secondary pin, the engagement state between the first pins and the second pins includes: outputting a first voltage on a backlight wire of the substrate to control the transistor to be turned on; outputting a second voltage to a source of the transistor on another wire on the substrate than the backlight wire; outputting, by the first pin with the secondary pin in the extension direction of said first pin, a third voltage; detecting, by the detecting circuit, a current or a voltage at a detection node, and feeding a detection result back to the judging circuit; and when the judging circuit of each determining sub-circuit determines that the received detection result is the same as a preset result, determining a normal engagement state between the first pins and the second pins; and when the judging circuit of any one determining sub-circuit determines that the received detection result is different from the preset result, determining an abnormal engagement state between the first pins and the second pins, and issuing an alarm signal.

In a possible implementation, in the determining method above according to the embodiment of this disclosure, the determining circuit includes at least one determining sub-circuit connected in a one-to-one manner with at least one secondary pin, and each determining sub-circuit includes a transistor, a resistor, a detecting circuit, and a judging circuit; and the determining, by the at least one secondary pin, of the connector, located in the extension direction of the first pin, and the determining circuit, on the substrate, connected with the secondary pin, the engagement state between the first pins and the second pins includes: outputting a first voltage on a backlight wire of the substrate to control the transistor to be turned on; outputting a second voltage to the resistor on another wire on the substrate than the backlight wire; outputting, by the first pin with the secondary pin in the extension direction of said first pin, a third voltage; detecting, by the detecting circuit, a current or a voltage at a detection node, and feeding a detection result back to the judging circuit; and when the judging circuit of each determining sub-circuit determines that the received detection result is the same as a preset result, determining a normal engagement state between the first pins and the second pins; and when the judging circuit of any one determining sub-circuit determines that the received detection result is different from the preset result, determining an abnormal engagement state between the first pins and the second pins, and issuing an alarm signal.

In a possible implementation, in the determining method above according to the embodiment of this disclosure, the determining circuit is connected with a plurality of secondary pins, and the determining circuit includes a transistor, a detecting circuit, a judging circuit, and a plurality of resistors corresponding one-to-one to the secondary pins; and the determining, by the at least one secondary pin, of the connector, located in the extension direction of the first pin, and the determining circuit, on the substrate, connected with the secondary pin or pins, the engagement state between the first pins and the second pins includes: outputting a first voltage on a backlight wire of the substrate to control the transistor to be turned on; outputting a second voltage to a source of the transistor on another wire on the substrate than the backlight wire; outputting, by the first pin with the secondary pin in the extension direction of said first pin, a third voltage; detecting, by the detecting circuit, a current or a voltage at a detection node, and feeding a detection result back to the judging circuit; and when the judging circuit determines that the received detection result is the same as a preset result, determining a normal engagement state between the first pins and the second pins; and when the judging circuit determines that the received detection result is different from the preset result, determining an abnormal engagement state between the first pins and the second pins, and issuing an alarm signal.

In a possible implementation, in the determining method above according to the embodiment of this disclosure, after the normal engagement state between the first pins and the second pins is determined, the method further includes: stopping the first pin with the secondary pin in the extension direction of said first pin is from outputting the third voltage; and outputting a fourth voltage on the backlight wire to control the transistor to be turned off.

In a possible implementation, in the determining method above according to the embodiment of this disclosure, after the abnormal engagement state between the first pins and the second pins is determined, the method further includes: determining an engagement state between the first pins and the second pins, both of which are engaged again.

Correspondingly an embodiment of this disclosure further provides a display device including the printed circuit board according to the above embodiment of this disclosure.

DETAILED DESCRIPTION

In the related art, the flexible printed circuit is generally connected with the printed circuit board through snap joint or soldering, or using a connector. The snap joint tends to be broken in a real operation due to improper operating by a human operator, or a poor quality of an snap piece, and when a connection interface of the printed circuit board including the snap piece is soldered on the printed circuit board, then it will be time-consuming and labor-consuming to redo the interface soldered on the printed circuit board. If they are soldered together, then they may be connected with a tin material, poorly soldered, etc., and particularly in a highly integrated minimized electronic device, there will be more defects as the number and the density of pins in the flexible printed circuit will grow, so the flexible printed circuit is generally electrically connected with the printed circuit board using a connector in the related art.

Figure 1:
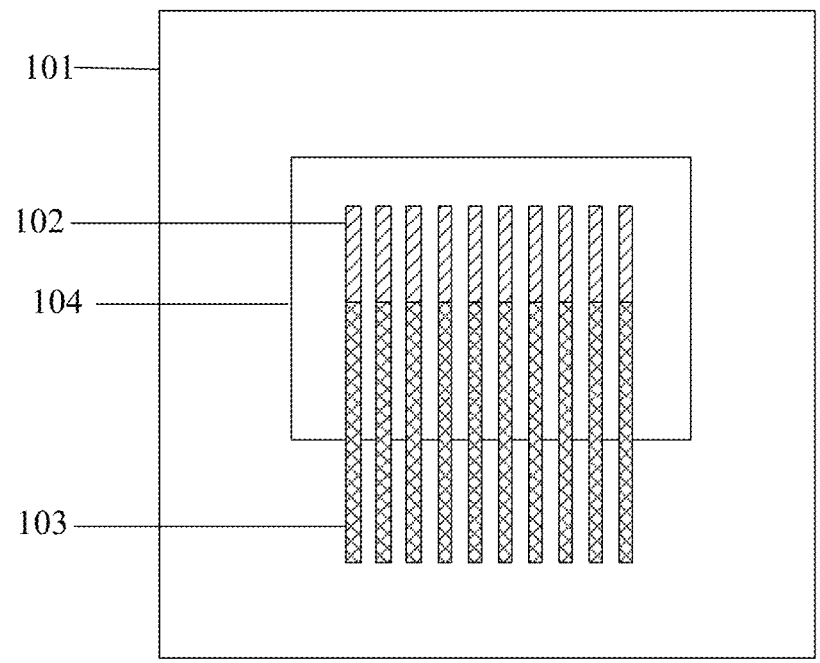
FIG. 1 is a schematic diagram of a normal engagement state between the printed circuit board and the flexible printed circuit in the related art.
Figure 2:
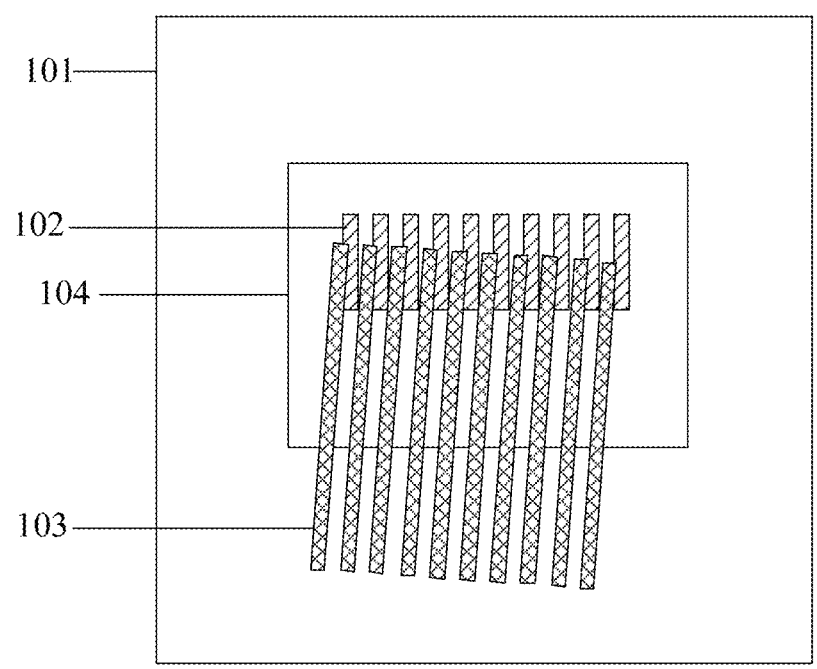
FIG. 2 is a schematic diagram of an abnormal engagement state between the printed circuit board and the flexible printed circuit in the related art.

Specifically as illustrated in FIG. 1, a printed circuit board 101 is electrically connected with a flexible printed circuit through pins 102 of a connector 104 contacting with pins 103 of the flexible printed circuit. However the inventors have identified that while the flexible printed circuit is being engaged with the printed circuit board 101 using the connector 104, it may be engaged using a part of the pins in an offset or inclined manner as illustrated in FIG. 2; and in this case, a pin 103 on the flexible printed circuit may be short-circuited, or abnormal otherwise, and at this time, when an electronic device is powered on, then large current may result in overburning of a line, or another abnormality, so the product may be wasted.

In view of this, the embodiments of this disclosure provide a printed circuit board, and a method for determining engagement state between the printed circuit board and a flexible printed circuit, to lower the probability that the flexible printed circuit is engaged abnormally with the printed circuit board, so as to avoid in effect large current or another risk from occurring when an electronic device is powered on, to alleviate the product from being wasted, and to improve a good yield ratio of the electronic device.

Implementations of the printed circuit board, and the method for determining engagement state between the printed circuit board and a flexible printed circuit, according to the embodiments of this disclosure will be described below in details with reference to the drawings. It shall be noted that the embodiments to be described are only a part but not all of the embodiments of this disclosure. Based upon the embodiments here of this disclosure, all the other embodiments which can occur to those ordinarily skilled in the art without any inventive effort shall fall into the claimed scope of this disclosure.

The shapes and sizes of respective components in the drawings are not intended to reflect any real proportions of the printed circuit board and the flexible printed circuit, but only intended to illustrate this disclosure.

Figure 3A:
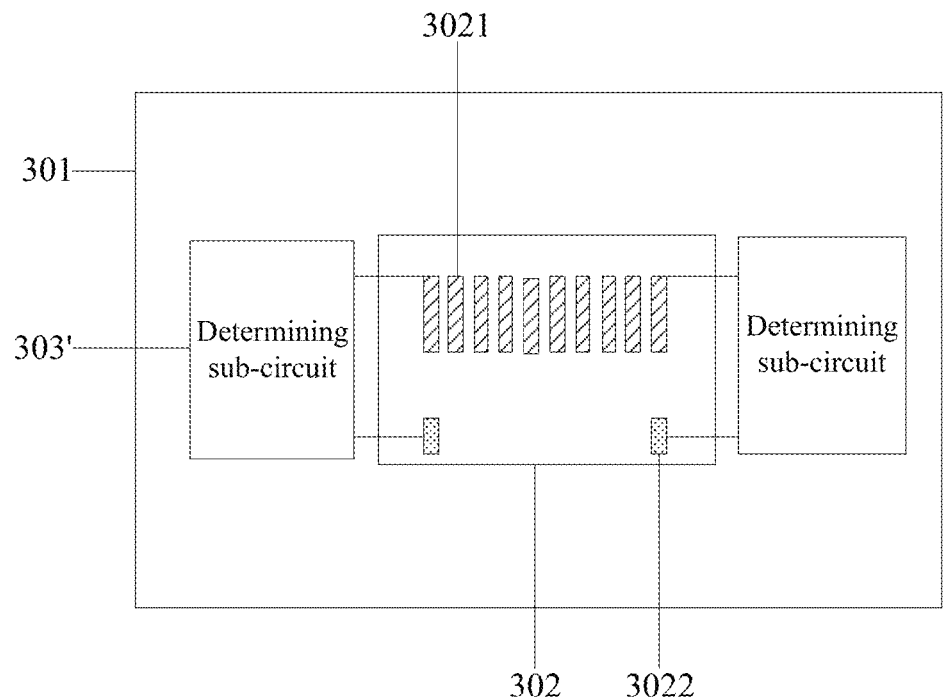
FIG. 3a to FIG. 3d are schematic structural diagrams of a printed circuit board according to an embodiment of this disclosure.
Figure 3B:
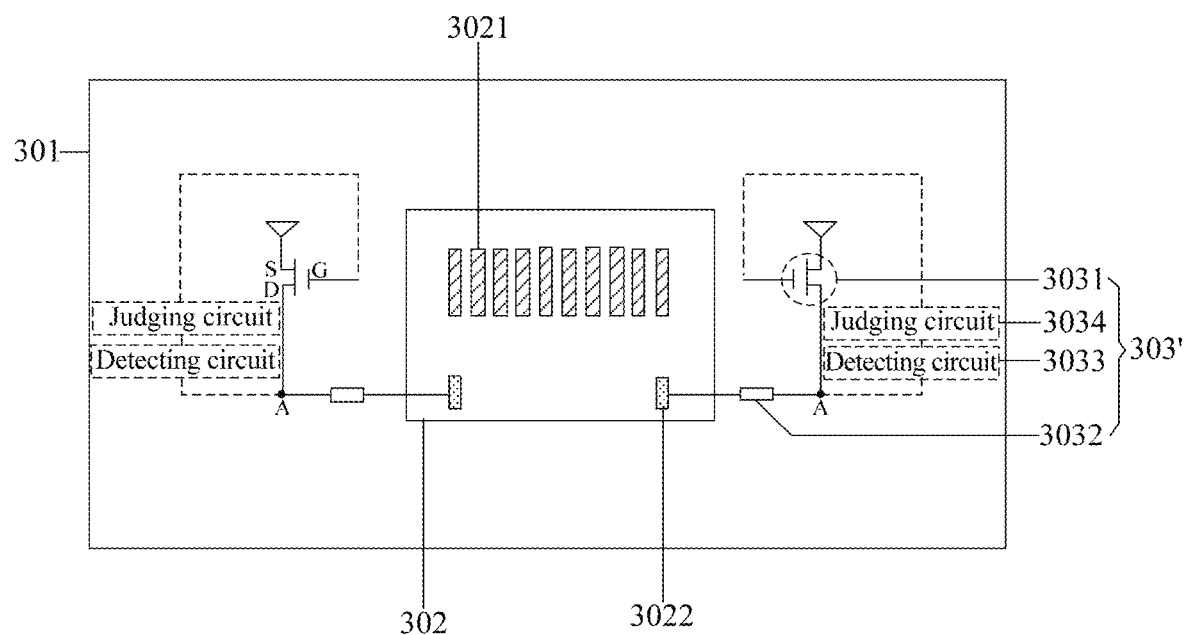
Figure 3C:
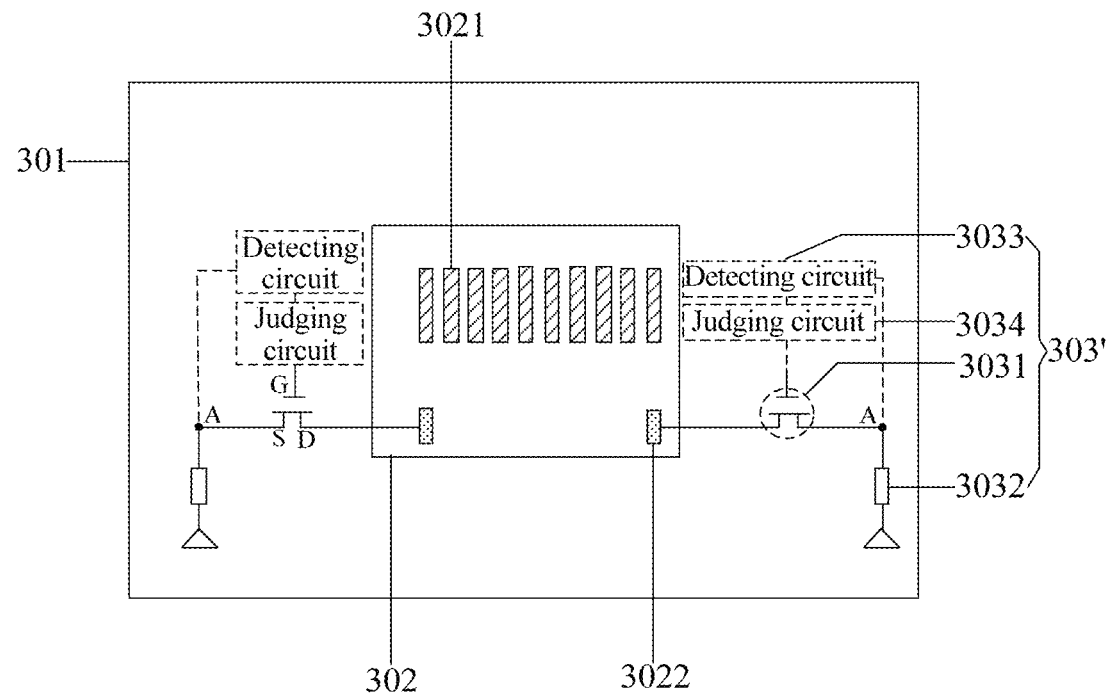
Figure 3D:
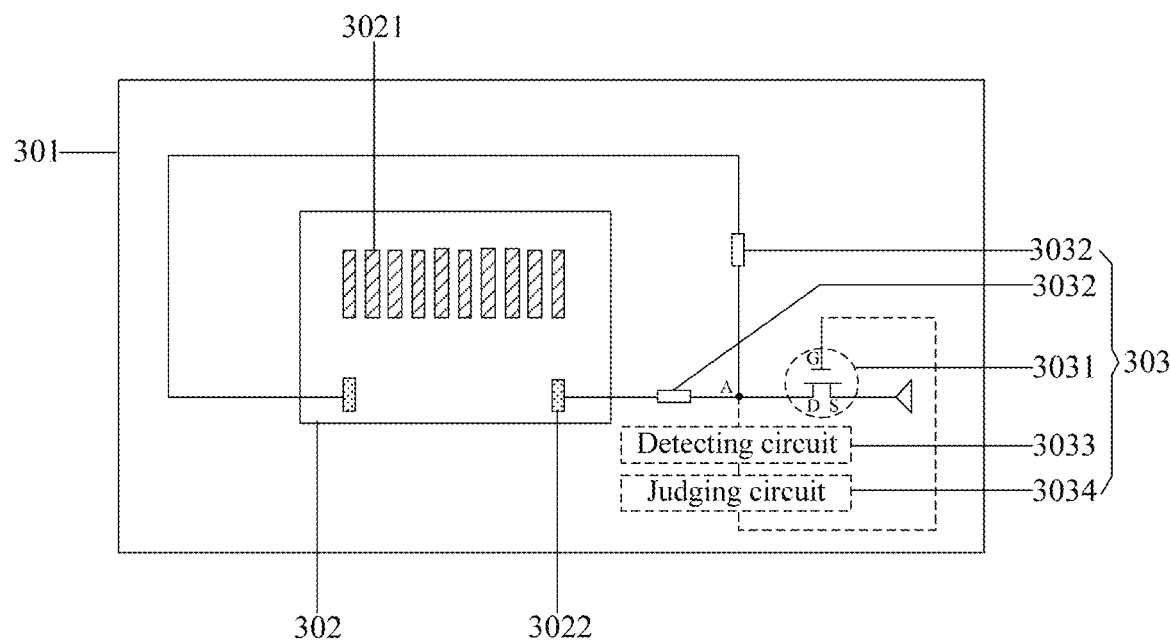

An embodiment of the disclosure provides a printed circuit board, as illustrated in FIG. 3a to FIG. 3d, the printed circuit board includes a substrate 301, a connector 302 fixed on the substrate 301 and configured to be connected with a flexible printed circuit, and a determining circuit 303 connected with the connector 302, where the determining circuit 303 can include a plurality of determining sub-circuits 303' (as illustrated in FIG. 3a to FIG. 3c), or can be a separate component (as illustrated in FIG. 3d).

The connector 302 includes a plurality of first pins 3021 and at least one secondary pin 3022, where the first pins 3021 are separate from the secondary pine 3022.

The plurality of the first pins 3021 are configured to be engaged in correspondence with a plurality of second pins 304 of the flexible printed circuit as illustrated in FIG. 4a to FIG. 4d.

The secondary pin 3022 is located in the extension direction of the first pin 3021 on the side of the first pin 3021 engaged in correspondence with the second pin 304.

The determining circuit 302 is connected with the secondary pin 3022, and configured to determine together with the secondary pin 3022 an engagement state between the first pins 3021 and the second pins 304.

In the printed circuit board above according to the embodiment of this disclosure, the secondary pin 3022 is added to the connector 302, and the secondary pin 3022 can cooperate with the determining circuit 303, which is added to the substrate 301 and connected with the secondary pin 3022, to determine an engagement state between the first pins 3021 of the connector 302, and the second pins 304 of the flexible printed circuit, so that an electronic device can be powered on after a normal engagement state is determined in a real application, so as to avoid in effect large current or another risk from occurring due to abnormal engagement, to alleviate the product from being wasted, and to improve a good yield ratio of the electronic device.

It shall be noted in the printed circuit board above according to the embodiment of this disclosure, when the connector 302 includes a plurality of secondary pins 3022, the plurality of secondary pins 3022 located in the extension direction of a same first pin 3021, or the plurality of secondary pins 3022 can alternatively be located respectively in the extension directions of a plurality of first pins 3021, that is, one first pin 3021 can correspond to a plurality of secondary pins 3022, or as illustrated in FIG. 3a to FIG. 3c, one first pin 3021 correspond to only one secondary pin 3022, although the embodiment of this disclosure will not be limited thereto. When the first pins 3021 correspond to the secondary pins 3022 in a one-to-one manner, an engagement state between the first pins 3021 and the second pins 304 can be determined while lowering a fabrication cost, and simplifying the structure of the connector 302, so optionally the first pins 3021 can be arranged to correspond to the secondary pins 3022 in a one-to-one manner in a real application.

Furthermore in the printed circuit board above according to the embodiment of this disclosure, the extension direction of a first pin 3021 refers to the movement direction of the first pin 3021 being normally engaged with a second pin 304. For example, in FIG. 3a to FIG. 3c, it refers to the length extension direction of the first pin 3021, i.e., a direction parallel to the vertical direction of the paper, and at this time, the secondary pin 3022 corresponds vertically to the first pin 3021.

Moreover in the printed circuit board above according to the embodiment of this disclosure, the first pins 3021 are separate from the secondary pins 3022, and particularly they are physical separate from each other, but also separate from each other in terms of their circuit connections. Specifically in FIG. 3a to FIG. 3c, for example, the secondary pins 3022 are arranged to correspond to, and separate from, the first pins 3021 in the vertical extension directions of the first pins 3021 on two side edges of the connector 302; and after the connector 302 is soldered on the substrate 301, the secondary pins 3022 are connected with the substrate 301, and the secondary pins 3022 are disconnected from their corresponding first pins 3021. Only when the first pins 3021 are engaged normally with the second pins 304, the first pins 3021 can be connected with the corresponding secondary pins 3022 in their extension directions through the second pins 304 as illustrated in FIG. 4a to FIG. 4d.

In view of this, in the printed circuit board above according to the embodiment of this disclosure, the determining circuit 303 can be configured: to determine a normal engagement state between a first pin 3021 and a second pin 304 upon determining that the first pin 3021 is connected with a secondary pin 3022 in the extension direction of the first pin 3021; and to determine an abnormal engagement state between a first pin 3021 and a second pin 304 upon determining that the first pin 3021 is disconnected from a secondary pin 3022 in the extension direction of the first pin 3021.

Specifically wires can be routed on both sides of the substrate 301, so in the printed circuit board above according to the embodiment of this disclosure, the determining circuit 303 can be arranged on the same side of the substrate 301 as the connector 302, or the determining circuit can alternatively be arranged on a different side of the substrate 301 from the connector 302, and the determining circuit 303 can be embodied as follows without any limitation thereto.

Figure 4A:
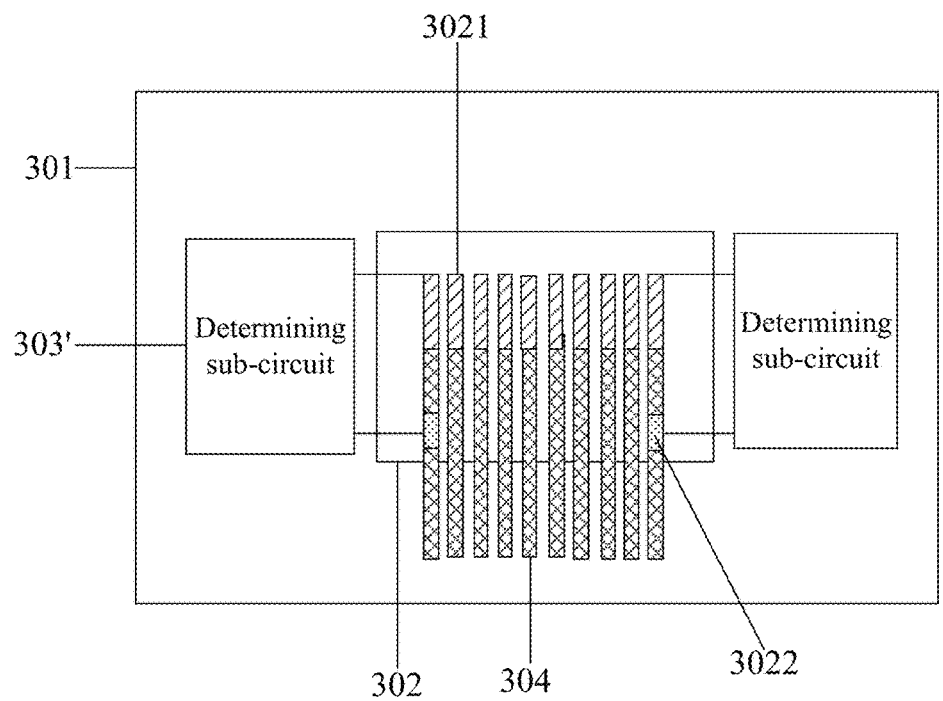
FIG. 4a to FIG. 4d are schematic diagrams of a normal engagement state between the printed circuit board according to the embodiment of this disclosure, and a flexible printed circuit.
Figure 4B:
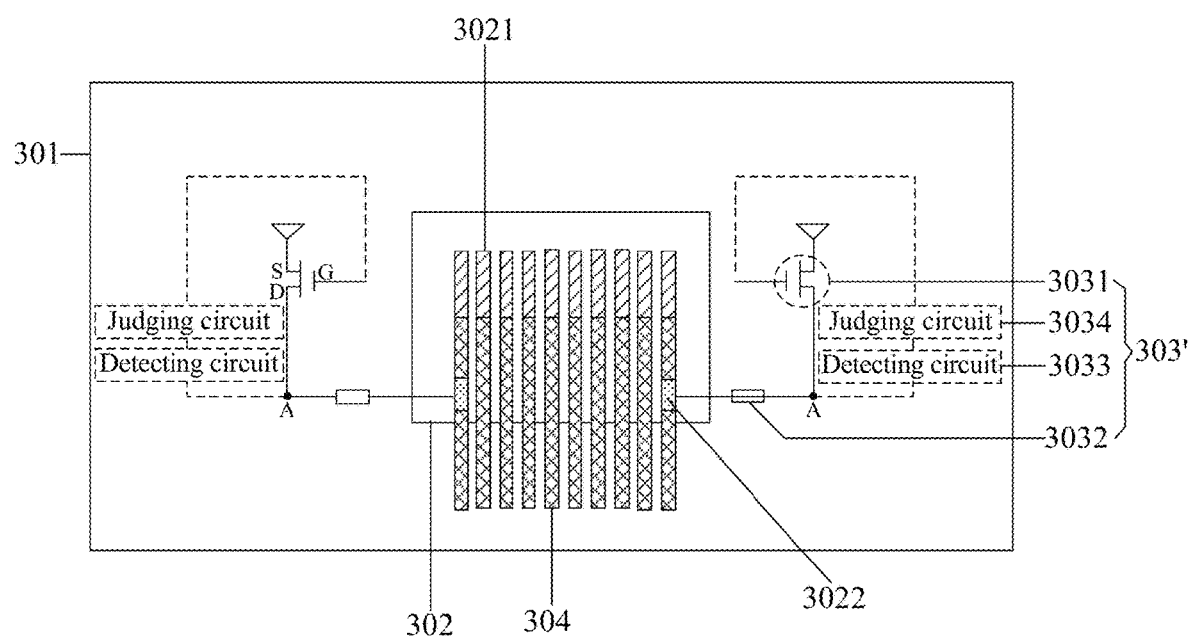

For example, as illustrated in FIG. 3b and FIG. 4b, the determining circuit 303 can include determining sub-circuits 303' connected in a one-to-one manner with the corresponding secondary pins 3022.

Each determining sub-circuit 303' includes a transistor 3031, a resistor 3032, a detecting circuit 3033, and a judging circuit 3034.

The transistor 3031 has a gate G connected with a backlight wire, which can provide a high-voltage, of the substrate 301, a drain D connected with a detection node A (i.e., any one point on the circuit between the transistor 3031 and the resistor 3032), and a source S connected with another wire on the substrate 301 than the backlight wire.

The resistor 3032 has one terminal connected with the detection node A, and the other terminal connected with the corresponding secondary pin 3022.

The detecting circuit 3033 is configured to detect a current or a voltage at the detection node A, and to feed a detection result back to the judging circuit 3034.

The judging circuit 3034 is configured to determine a normal engagement state between the first pin 3021 and the second pin 304 upon determining that the received detection result is the same as a preset result; and to determine an abnormal engagement state between the first pin 3021 and the second pin 304 upon determining that the received detection result is different from the preset result, and to issue an alarm signal.

Specifically in the printed circuit board above according to the embodiment of this disclosure, after the first pin 3021 is engaged with the second pin 304, the backlight wire outputs a first voltage to control the transistor 3031 to be turned on, the other wire than the backlight wire provide a second voltage to the determining sub-circuit 303', and the first pin 3021 with the secondary pin 3022 in the extension direction thereof outputs a third voltage. When the first pin 3021 is connected with the secondary pin 3022, that is, the first pin 3021 and the secondary pin 3022 are formed conductive path through the second pin 304, then a conductive path can be formed between the respective components of the determining sub-circuit 303' and the first pin 3021, a voltage difference across the determining sub-circuit 303' may be the difference between the second voltage and the third voltage, and at this time, there may be a fixed value of the current or the voltage at the detection node A, and this fixed is set as a preset result; and when the first pin 3021 is disconnected from the secondary pin 3022 in the extension direction of the first pin 3021, then a conductive path is formed between the respective components of the determining sub-circuit 303', the voltage difference across the determining sub-circuit 303' can be the second voltage, and the current or the voltage at the detection node A may vary accordingly, and be different from the preset result above.

Following the principle above, when the judging circuit 3034 of each determining sub-circuit 303' determines that the received detection result is the same as the preset result, a normal engagement state between the first pins 3021 and the second pins 304 is determined; and when the judging circuit 3034 of any one determining sub-circuit 303' determines that the received detection result is different from the preset result, an abnormal engagement state between the first pins 3021 and the second pins 304 is determined, and an alarm signal is issued.

Of course, in a specific implementation, the judging circuit 3034 can be further provided with a real calculation capability so that the judging circuit 3034 obtains in real time the voltage value of the second voltage provided by the other wire than the backlight wire, and the voltage value of the third voltage output by the first pin 3021 with the secondary pin 3022 in the extension direction, and to calculate the current or the voltage at the detection node A when the first pin 3021 is connected with the secondary pin 3022 in the extension direction; to determine a normal engagement state between the first pin 3021 and the second pin 304 upon determining that the detection result fed back by the detecting circuit 3033 is the same as a calculation result; and to determine an abnormal engagement state between the first pin 3021 and the second pin 304 upon determining that the detection result fed back by the detecting circuit 3033 is from the calculation result.

In a real application, when a normal engagement state between the first pin 3021 and the second pin 304 is determined, the first pin 3021 can be stopped from outputting voltage, and the transistor 3031 can be controlled through the backlight wire to be turned off to thereby prepare the electronic device for subsequent normal operating; and when an abnormal engagement state between the first pin 3021 and the second pin 304 is determined, after the first pin 3021 is stopped from outputting voltage, and the transistor 3031 is controlled through the backlight wire to be turned off, the first pin 3021 is engaged again with the second pin 304, and then the determining sub-circuit 303' determines together with the secondary pin 3022 an engagement state between the first pin 3021 and the second pin 304, both of which are engaged again.

Figure 4C:
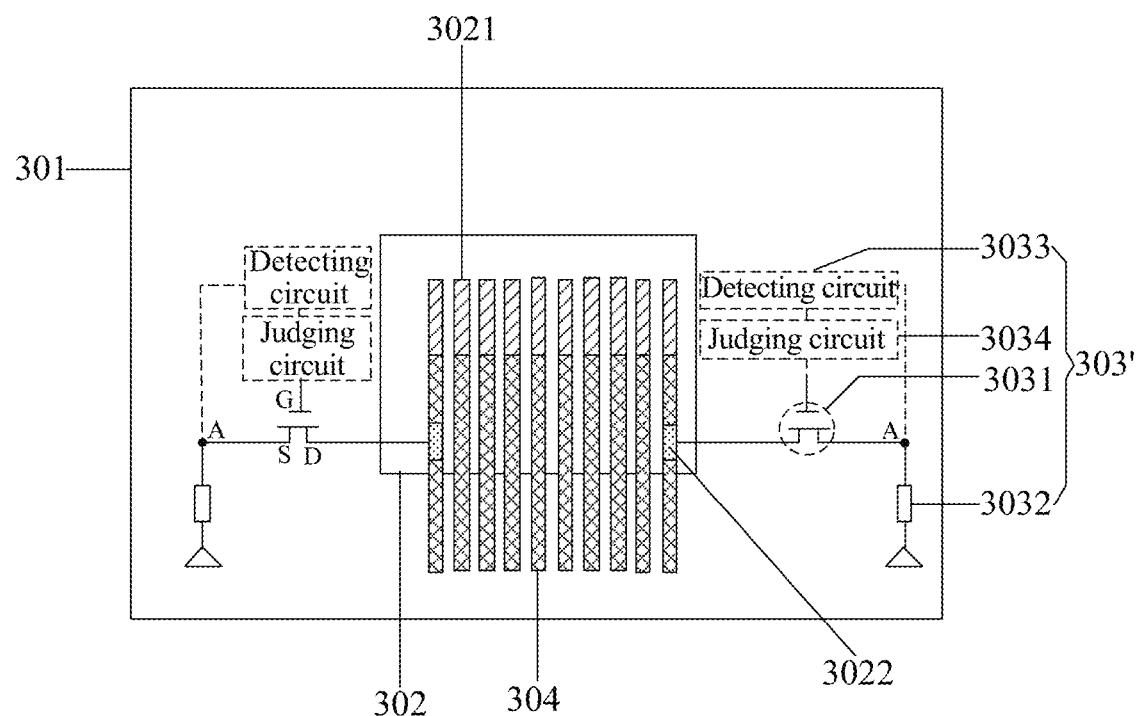
Figure 4D:
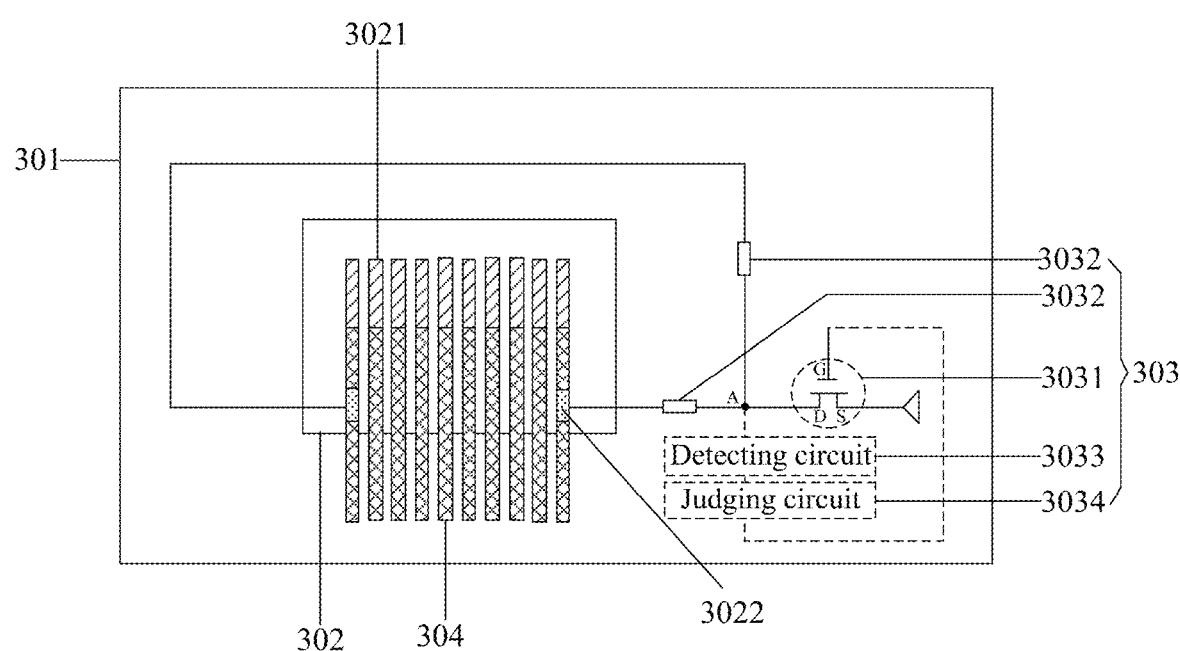

In another example, after the normal engagement state between the first pin 3021 and the second pin 304 is determined, in order to avoid the resistor 3032, the detecting circuit 3033, and the judging circuit 3034 from subsequently hindering the normal operating of the electronic device, optionally in the printed circuit board above according to the embodiment of this disclosure, the transistor 3031 can be connected with the secondary pin 3022; and specifically as illustrated in FIG. 3c and FIG. 4c, the determining circuit 303 includes determining sub-circuits 303' connected in a one-to-one corresponding manner with the corresponding secondary pins 3022, and each determining sub-circuit 303' includes a transistor 3031, a resistor 3032, a detecting circuit 3033, and a judging circuit 3034.

The transistor 3031 has a gate G connected with a backlight wire of the substrate 301, a drain D connected with the corresponding secondary pin 3022, and a source S connected with a detection node A (i.e., any one point on the circuit between the transistor 3031 and the resistor 3032).

The resistor 3032 has one terminal connected with the detection node A, and the other terminal connected with another wire on the substrate 301 than the backlight wire.

The detecting circuit 3033 is configured to detect a current or a voltage at the detection node A, and to feed a detection result back to the judging circuit 3034.

The judging circuit 3034 is configured to determine a normal engagement state between the first pin 3021 and the second pin 304 upon determining that the received detection result is the same as a preset result; and to determine an abnormal engagement state between the first pin 3021 and the second pin 304 upon determining that the received detection result is different from the preset result, and to issue an alarm signal.

In still another example, in order to simplify the structure of the determining circuit 303, a plurality of secondary pins 3022 can share a transistor 3031, a detecting circuit 3033, and a judging circuit 3034, that is, as illustrated in FIG. 3d and FIG. 3d, the determining circuit 303 can be connected with the plurality of secondary pins 3022, and the determining circuit 303 includes a transistor 3031, a detecting circuit 3033, a judging circuit 3034, and a plurality of resistors 3032 corresponding one-to-one to the plurality of secondary pins 3022.

The transistor 3031 has a gate G connected with a backlight wire of the substrate 301, a drain D connected with a detection node A (i.e., any one point on the trunk between the transistor 3031 and the respective resistors 3032), and a source S connected with another wire on the substrate 301 than the backlight wire.

Each resistor 3032 has one terminal connected with the detection node A, and the other terminal connected with the corresponding secondary pin 3022.

The detecting circuit 3033 is configured to detect a current or a voltage at the detection node A, and to feed a detection result back to the judging circuit 3034.

The judging circuit 3034 is configured to determine a normal engagement state between the first pin 3021 and the second pin 304 upon determining that the received detection result is the same as a preset result (i.e., the current or the voltage at the detection node A when the secondary pin 3022 is connected with the first pin 3021 when the first pins are engaged with the second pins); and to determine an abnormal engagement state between the first pin 3021 and the second pin 304 upon determining that the received detection result is different from the preset result, and to issue an alarm signal.

It shall be noted that in the printed circuit board above according to the embodiment of this disclosure, the detecting circuit 3033 and the judging circuit 3034 can be arranged on the substrate 301 as illustrated in FIG. 3a to FIG. 3d; or can be arranged on another component than the substrate 301 as needed in a real application scenario, although the embodiment of this disclosure will not be limited thereto.

Furthermore the detecting circuit 3033 in the embodiment of this disclosure can be any circuit with a current or voltage detecting function as well known to those skilled in the art, and the judging circuit 3034 in the embodiment of this disclosure can be any circuit with a determining function as well known to those skilled in the art.

Moreover the detecting circuit 3033 and the judging circuit 3034 are only one determining means according to the embodiment of this disclosure, but the determining function can alternatively be performed using one or more other pieces of software or hardware in a real application, so the claimed scope of this disclosure will not be limited to the detecting circuit 3033 and the judging circuit 3034 as illustrated in FIG. 3a to FIG. 3d.

Furthermore in the printed circuit board above according to the embodiment of this disclosure, the transistors 3031 each can be a Thin Film Transistor (TFT), or can be a Metal Oxide Semiconductor Field-Effect Transistor (MOS), although the embodiment of this disclosure will not be limited thereto. In a specific implementation, the sources and the drains of these transistors 3031 can be functionally replaced with each other dependent upon their different transistor types and input signals instead of being distinguished from each other.

Optionally in the printed circuit board above according to the embodiment of this disclosure, the transistor 3031 is an N-type transistor or a P-type transistor, although the embodiment of this disclosure will not be limited thereto. When the transistor 3031 is a P-type transistor, it is turned off by a high-level signal, and turned on by a low-level signal, its source is configured to accept an input electrical signal, and its drain is configured to output an electrical signal. When the transistor 3031 is an N-type transistor, it is turned on by a high-level signal, and turned off by a low-level signal, its drain is configured to accept an input electrical signal, and its source is configured to output an electrical signal.

Optionally in order to lower a fabrication cost, in the printed circuit board above according to the embodiment of this disclosure, the transistor 3031 is a P-channel Metal Oxide Semiconductor Field-Effect Transistor (P-MOS).

Figure 5A:
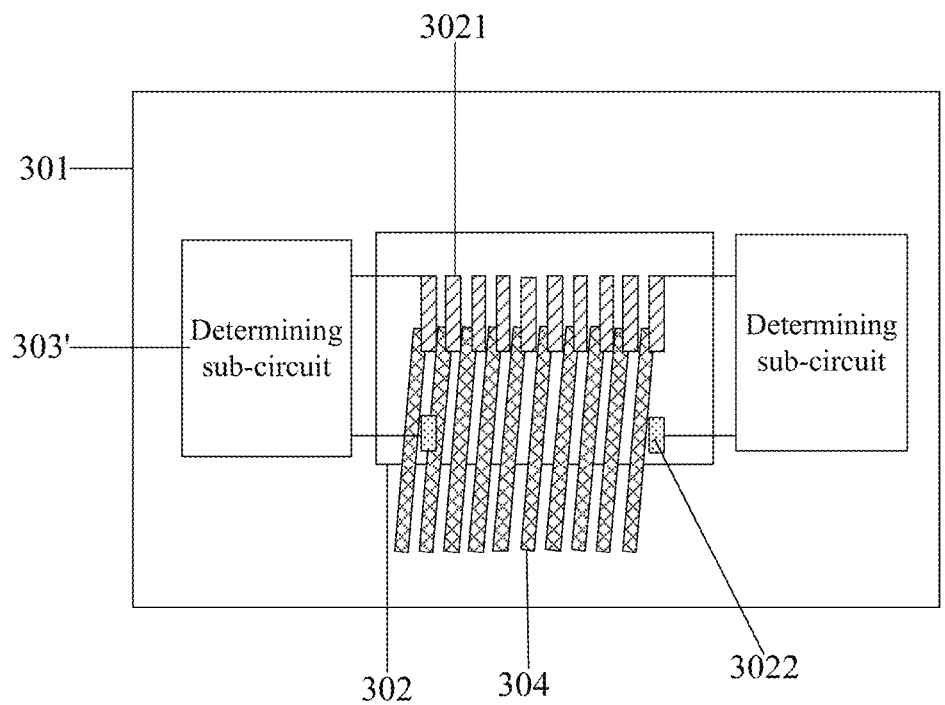
FIG. 5a and FIG. 5b are schematic diagrams of an abnormal engagement state between the printed circuit board of FIG. 3a and the flexible printed circuit according to the embodiment of this disclosure.

Specifically in the printed circuit board above according to the embodiment of this disclosure, a first pin 3021 may be engaged abnormally with a second pin 304. Specifically by way of an example in which the first pins 3021 on the left and right side edges of the connector 302 correspond respectively to secondary pins 3022 in a one-to-one manner, as illustrated in FIG. 5a, the first pin 3021 on the left side edge of the connector 302 is connected with the second pin 304, and the secondary pin 3022 corresponding to the first pin 302 on the left side edge is disconnected from the second pin 304; and the first pin 3021 on the right side edge of the connector 302 is connected with the second pin 304, and the secondary pin 3022 corresponding to the first pin 3021 on the right side edge is disconnected from the second pin 304. Or as illustrated in FIG. 5b, both the first pins 3021 on the left and right side edges of the connector 302, and the secondary pins 3022 corresponding respectively to the first pins 3021 on the left and right side edges are disconnected from the second pins 304.

Figure 5B:
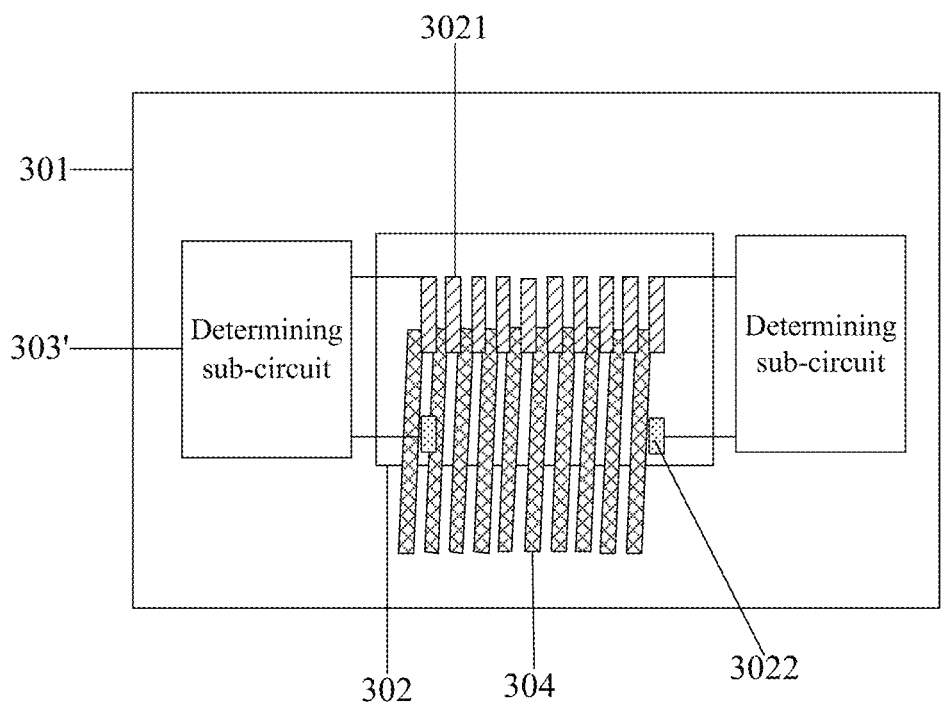

Optionally as can be apparent from FIG. 5a and FIG. 5b, when the first pins 3021 are engaged abnormally with the second pins 304, the respective second pins 304 are uniformly inclined from the corresponding first pins 3021 engaged therewith, so it can be determined that all the first pins 3021 are engaged normally with their corresponding second pins 304 only if the two first pins 3021 on the left and right side edges of the connector 302 are engaged normally with the second pins 304.

In view of this, optionally in the printed circuit board above according to the embodiment of this disclosure, the secondary pins 3022 can include a first secondary pin and a second secondary pin.

The first secondary pin is located in the extension direction of the first pin 3021 on one side edge of the connector 302, and the second secondary pin is located in the extension direction of the first pin 3021 on the opposite side edge of the connector 302.

Specifically as illustrated in FIG. 3a to FIG. 3d, the first secondary pin can be located in the extension direction of the first pin 3021 on the left side edge of the connector, and the second secondary pin can be located in the extension direction of the first pin 3021 on the right side edge of the connector; or the first secondary pin can be located in the extension direction of the first pin 3021 on the right side edge of the connector, and the second secondary pin can be located in the extension direction of the first pin 3021 on the left side edge of the connector, although the embodiment of this disclosure will not be limited thereto.

Based upon the same inventive idea, an embodiment of this disclosure further provides a method for determining an engagement state between the printed circuit board above and a flexible printed circuit, and since the determining method addresses the problem under a similar principle to the printed circuit board above, reference can be made to an implementation of the printed circuit board above according to the embodiment of this disclosure, for an implementation of the determining method according to the embodiment of this disclosure, and a repeated description thereof will be omitted here.

Figure 6:
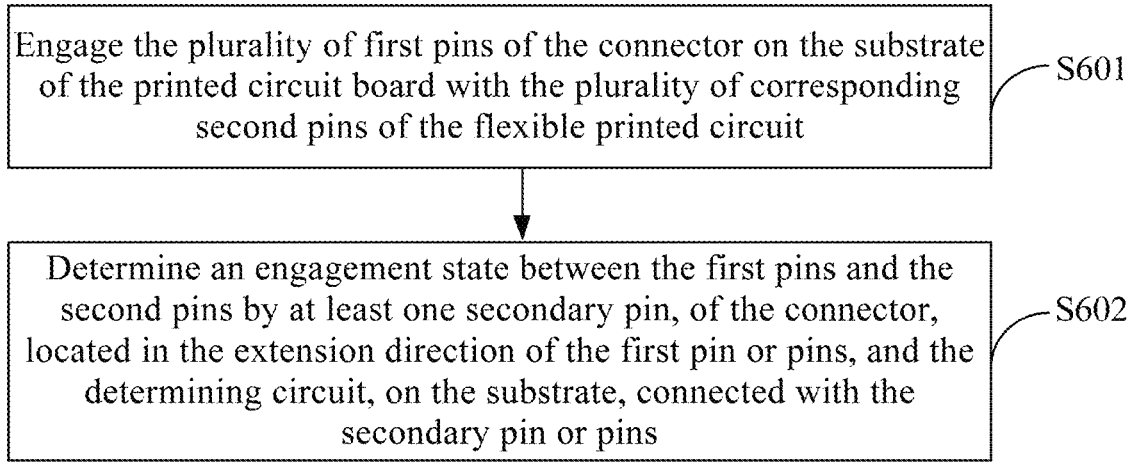
FIG. 6 is a flow chart of a method for determining engagement state between the printed circuit board and a flexible printed circuit according to the embodiment of this disclosure.

Specifically as illustrated in FIG. 6, a method for determining engagement state between the printed circuit board above and a flexible printed circuit according to an embodiment of this disclosure can particularly include the following steps.

The step S601 is to engage the plurality of first pins of the connector on the substrate of the printed circuit board with the plurality of second pins of the flexible printed circuit.

The step S602 is to determine an engagement state between the first pins and the second pins by the at least one secondary pin, of the connector, located in the extension direction of the first pin(s), and the determining circuit, on the substrate, connected with the at least one secondary pin.

In a specific implementation, in the determining method above according to the embodiment of this disclosure, the step S602 of determining the engagement state between the first pins and the second pins by the at least one secondary pin, of the connector, located in the extension direction of the first pin(s), and the determining circuit, on the substrate, connected with the secondary pin can be performed specifically in the following steps.

The determining circuit determines a normal engagement state between the first pins and the second pins upon determining that the first pin(s) is (are) connected with the secondary pin or pins in the extension direction(s) the first pin(s) when the first pins are engaged with the second pins; and determines an abnormal engagement state between the first pins and the second pins upon determining that the first pin(s) is(are) disconnected from the secondary pin(s) in the extension(s) of the first pin(s) when the first pins are engaged with the second pins.

In a specific implementation, in the determining method above according to the embodiment of this disclosure, the determining circuit can include at least one determining sub-circuit connected in a one-to-one manner with the at least one secondary pin, where each determining sub-circuit includes a transistor, a resistor, a detecting circuit, and a judging circuit.

In this manner, the step S602 of determining an engagement state between the first pins and the second pins by the at least one secondary pin, of the connector, located in the extension direction of the first pin(s), and the determining circuit, on the substrate, connected with the secondary pin can be performed particularly in the following steps.

The backlight wire of the substrate outputs a first voltage to control the transistor to be turned on.

Another wire on the substrate than the backlight wire outputs a second voltage a source of the transistor.

The first pin with the secondary pin in the extension direction thereof outputs a third voltage.

The detecting circuit detects a current or a voltage at a detection node, and feeds a detection result back to the judging circuit.

When the judging circuit of each determining sub-circuit determines that the received detection result is the same as a preset result, a normal engagement state between the first pins and the second pins is determined; and when the judging circuit of any one determining sub-circuit determines that the received detection result is different from the preset result, an abnormal engagement state between the first pins and the second pins is determined, and an alarm signal is issued.

In a specific implementation, in order to avoid the resistor, the detecting circuit 3033, and the judging circuit from subsequently hindering the normal operating of an electronic device, optionally in the determining method above according to the embodiment of this disclosure, the determining circuit includes at least one determining sub-circuit connected in a one-to-one manner with the at least one secondary pin, and each determining sub-circuit includes a transistor, a resistor, a detecting circuit, and a judging circuit.

In this manner, the step S602 of determining an engagement state between the first pins and the second pins by the at least one secondary pin, of the connector, located in the extension direction of the first pin(s), and the determining circuit, on the substrate, connected with the secondary pin can be performed particularly in the following steps.

A backlight wire of the substrate outputs a first voltage to control the transistor to be turned on.

Another wire on the substrate than the backlight wire outputs a second voltage to the resistor.

The first pin with the secondary pin in the extension direction outputs third voltage.

The detecting circuit detects a current or a voltage at a detection node, and feeds a detection result back to the judging circuit.

When the judging circuit of each determining sub-circuit determines that the received detection result is the same as a preset result, a normal engagement state between the first pins and the second pins is determined; and when the judging circuit of any one determining sub-circuit determines that the received detection result is different from the preset result, an abnormal engagement state between the first pins and the second pins is determined, and an alarm signal is issued.

In a specific implementation, in order to simplify the structure of the determining circuit, in the determining method above according to the embodiment of this disclosure, the determining circuit can alternatively be connected with the plurality of secondary pins, and the determining circuit includes a transistor, a detecting circuit, a judging circuit, and a plurality of resistors corresponding in a one-to-one manner to the secondary pins.

In this manner, the step S602 of determining an engagement state between the first pins and the second pins by the at least one secondary pin, of the connector, located in the extension direction of the first pin(s), and the determining circuit, on the substrate, connected with the secondary pins can be performed particularly in the following steps.

A backlight wire of the substrate outputs a first voltage to control the transistor to be turned on.

Another wire on the substrate than the backlight wire outputs a second voltage to a source of the transistor.

The first pin with the secondary pin in the extension direction outputs third voltage.

The detecting circuit detects a current or a voltage at a detection node, and feeds a detection result back to the judging circuit.

The judging circuit determines a normal engagement state between the first pins and the second pins, upon determining that the received detection result is the same as a preset result; and determines an abnormal engagement state between the first pins and the second pins upon determining that the received detection result is different from the preset result, and issues an alarm signal.

In a specific implementation, in the determining method above according to the embodiment of this disclosure, after the normal engagement state between the first pins and the second pins is determined, the method can further include the following steps to prepare the electronic device for being subsequently powered on normally.

The first pin with the secondary pin in the extension direction is stopped from outputting the third voltage.

The backlight wire outputs a fourth voltage to control the transistor to be turned off.

In a specific implementation in the determining method above according to the embodiment of this disclosure, after the abnormal engagement state between the first pins and the second pins is determined, and the alarm signal is issued, the method can further include the following step.

An engagement state between the first pins and the second pins, both of which are engaged again, is determined.

The method for determining an engagement state between the printed circuit board above and a flexible printed circuit according to the embodiment of the invention will be described below in details by way of an example in which the printed circuit board and the flexible printed circuit are configured in a lighting device.

Specifically as illustrated in FIG. 4b, one secondary pin 3022 is arranged respectively in the extension direction of the first pin 3021 on each of the left and right side edges of the connector 302 on the substrate 301 of the printed circuit board, and the determining circuit 303 includes two determining sub-circuits 303' connected respectively with the secondary pins 3022. The following description will be made by way of an example in which a transistor 3031 in each determining sub-circuit 303' is a P-channel Metal Oxide Semiconductor Field-Effect Transistor (P-MOS).

After the lighting device is started, firstly the two determining sub-circuits 303' determine an engagement state between the first pins 3021, and the second pins 304 of the flexible printed circuit, and upon determining a normal engagement state, the lighting device is further lightened normally; and upon determining an abnormal engagement state, an alarm signal is issued, and the two determining sub-circuits 303' determine again an engagement state between the first pins 3021 and the second pins 304, both of which are engaged again.

Specifically after the lighting device is started, the first voltage is output on backlight wire of the substrate 301 to control the two P-MOSs to be turned on respectively; the two P-MOSs are provided respectively with the second voltage on other wires of the substrate 301 than the backlight wires; the two first pins 3021 corresponding to the two secondary pins 3022 output the third voltage respectively, where the second voltage is generally higher than the third voltage; and the two detecting circuits 3033 detect the current or the voltage at the detection node A respectively, and feed detection results back to their corresponding judging circuits 3034.

When both of the two judging circuits 3034 determine that the received detection results are the same as a preset result, a normal engagement state between the first pins 3021 and the second pins 304 is determined, and thereafter the two first pins 3021 on the left and right side edges are stopped from outputting the third voltage, and the fourth voltage is output on the backlight wire to control the P-MOSs to be turned off. Specifically the first voltage controlling the P-MOSs to be turned on is lower than the fourth voltage controlling the P-MOSs to be turned off, and generally normal operating voltage of backlight is set to the fourth voltage controlling the P-MOSs to be turned off. Since the higher OFF-voltage can be provided on the backlight wire, the P-MOSs can be turned off more satisfactorily to thereby facilitate final normal powering-on of the lighting device.

When either of the two judging circuits 3034 determines that the received detection result is different from the preset result, an abnormal engagement state between the first pins 3021 and the second pins 304 is determined, and an alarm is made; and after the first pins 3021 are engaged again with the second pins 304, the two determining sub-circuit 303' determine again an engagement state between the first pins 3021 and the second pins 304, both of which are engaged again, until the first pins 3021 are engaged normally with the second pins 304 so that the lighting device is lightened normally.

In the printed circuit board, and the method for determining an engagement state between the printed circuit board and a flexible printed circuit, according to the embodiments of this disclosure, the printed circuit board includes a substrate, a connector fixed on the substrate, and configured to be connected with the flexible printed circuit, and a determining circuit connected with the connector, where the connector includes a plurality of first pins and at least one secondary pin, and the first pins are separate from the secondary pin; the first pins are configured to be engaged correspondingly with a plurality of second pins of the flexible printed circuit; the secondary pin is located in an extension direction of the first pin on a side of the first pin engaged in correspondence with the second pin; and the determining circuit is connected with the secondary pin, and configured to determine together with the secondary pin an engagement state between the first pins and the second pins. The secondary pin is added to the connector, and can determine together with the determining circuit, added to the substrate, connected with the secondary pin, an engagement state between the first pins of the connector, and the second pins of the flexible printed circuit, so that an electronic device can be powered on after a normal engagement state is determined in a real application, so as to avoid in effect large current or another risk from occurring due to abnormal engagement, to alleviate the product from being wasted, and to improve a good yield ratio of the electronic device.

It shall be noted that in this context, the relationship terms, e.g., "first", "second", etc., are only intended to distinguish one entity or operation from another entity or operation, but not intended to require or suggest any such a real relationship or order between these entities or operations.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A printed circuit board, comprising:
 a substrate;
 a connector fixed on the substrate, and configured to be connected with a flexible printed circuit, wherein the connector comprises a plurality of first pins and at least one secondary pin, and the first pins are separate from the secondary pin; the first pins are configured to be engaged correspondingly with a plurality of second pins of the flexible printed circuit; the secondary pin is located in an extension direction of the first pin on a side of the first pin engaged in correspondence with the second pin; and
 a determining circuit connected with the secondary pin, wherein the determining circuit is configured to determine together with the secondary pin an engagement state between the first pins and the second pins.

2. The printed circuit board according to claim 1, wherein the determining circuit is configured:
 to determine a normal engagement state between the first pins and the second pins, upon determining that the first pin is connected with the secondary pin in the extension direction of said first pin when the first pins are engaged with the second pins; and
 to determine that an abnormal engagement state between the first pins and the second pins, upon determining that the first pin is disconnected from the secondary pin in the extension direction of said first pin when the first pins are engaged with the second pins.

3. The printed circuit board according to claim 1, wherein the determining circuit comprises at least one determining sub-circuit connected in a one-to-one manner with the at least one secondary pin; and
 each determining sub-circuit comprises a transistor, a resistor, a detecting circuit, and a judging circuit, wherein:
 the transistor has a gate connected with a backlight wire of the substrate, a drain connected with a detection node, and a source connected with another wire on the substrate than the backlight wire;
 the resistor has one terminal connected with the detection node, and the other terminal connected with a corresponding secondary pin;
 the detecting circuit is configured to detect a current or a voltage at the detection node, and to feed a detection result back to the judging circuit; and
 the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

4. The printed circuit board according to claim 1, wherein the determining circuit comprises at least one determining sub-circuit connected in a one-to-one manner with the at least one secondary pin, and each determining sub-circuit comprises a transistor, a resistor, a detecting circuit, and a judging circuit, wherein:
 the transistor has a gate connected with a backlight wire of the substrate, a drain connected with a corresponding secondary pin, and a source connected with a detection node;
 the resistor has one terminal connected with the detection node, and the other terminal connected with another wire on the substrate than the backlight wire;
 the detecting circuit is configured to detect a current or a voltage at the detection node, and to feed a detection result back to the judging circuit; and
 the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

5. The printed circuit board according to claim 1, wherein the determining circuit is connected with a plurality of secondary pins, and the determining circuit comprises a transistor, a detecting circuit, a judging circuit, and a plurality of resistors corresponding one-to-one to the secondary pins, wherein:
 the transistor has a gate connected with a backlight wire of the substrate, a drain connected with a detection node, and a source connected with another wire on the substrate than the backlight wire;
 each resistor has one terminal connected with the detection node, and the other terminal connected with a corresponding secondary pin;
 the detecting circuit is configured to detect a current or a voltage at the detection node, and to feed a detection result back to the judging circuit; and
 the judging circuit is configured to determine a normal engagement state between the first pins and the second pins upon determining that the received detection result is the same as a preset result; and to determine an abnormal engagement state between the first pins and the second pins upon determining that the received detection result is different from the preset result, and to issue an alarm signal.

6. The printed circuit board according to claim 1, wherein the at least one secondary pin comprises a first secondary pin and a second secondary pin, wherein:

the first secondary pin is located in the extension direction of the first pin on one side edge of the connector, and the second secondary pin is located in the extension direction of the first pin on an opposite side edge of the connector.

7. A method for determining engagement state of the printed circuit board according to claim 1, comprising:
engaging the plurality of first pins of the connector on the substrate of the printed circuit board with the plurality of the second pins of the flexible printed circuit; and
determining, by the at least one secondary pin, of the connector, located in the extension direction of the first pin, and the determining circuit, on the substrate, connected with the secondary pin, the engagement state between the first pins and the second pins.

8. The method according to claim 7, wherein the determining, by the at least one secondary pin, of the connector, located in the extension direction of the first pin, and the determining circuit, on the substrate, connected with the secondary pin, the engagement state between the first pins and the second pins comprises:
determining, by the determining circuit, a normal engagement state between the first pins and the second pins upon determining that the first pin is connected with the secondary pin in the extension of said first pin when the first pins are engaged with the second pins; and determining an abnormal engagement state between the first pins and the second pins upon determining that the first pin is disconnected from the secondary pin when the first pins are engaged with the second pins.

9. The method according to claim 7, wherein the determining circuit comprises at least one determining sub-circuit connected in a one-to-one manner with the at least one secondary pin, and each determining sub-circuit comprises a transistor, a resistor, a detecting circuit, and a judging circuit; and
the determining, by the at least one secondary pin, of the connector, located in the extension direction of the first pin, and the determining circuit, on the substrate, connected with the secondary pin, the engagement state between the first pins and the second pins comprises:
outputting a first voltage on a backlight wire of the substrate to control the transistor to be turned on;
outputting a second voltage to a source of the transistor on another wire on the substrate than the backlight wire;
outputting, by the first pin with the secondary pin in the extension direction of said first pin, a third voltage;
detecting, by the detecting circuit, a current or a voltage at a detection node, and feeding a detection result back to the judging circuit; and
when the judging circuit of each determining sub-circuit determines that the received detection result is the same as a preset result, determining a normal engagement state between the first pins and the second pins; and when the judging circuit of any one determining sub-circuit determines that the received detection result is different from the preset result, determining an abnormal engagement state between the first pins and the second pins, and issuing an alarm signal.

10. The method according to claim 7, wherein the determining circuit comprises at least one determining sub-circuit connected in a one-to-one manner with the at least one secondary pin, and each determining sub-circuit comprises a transistor, a resistor, a detecting circuit, and a judging circuit; and
the determining, by the at least one secondary pin, of the connector, located in the extension direction of the first pin, and the determining circuit, on the substrate, connected with the secondary pin or pins, the engagement state between the first pins and the second pins comprises:
outputting a first voltage on a backlight wire of the substrate to control the transistor to be switched on;
outputting a second voltage to the resistor on another wire on the substrate than the backlight wire;
outputting, by the first pin with the secondary pin in the extension direction of said first pin, a third voltage;
detecting, by the detecting circuit, a current or a voltage at a detection node, and feeding a detection result back to the judging circuit; and
when the judging circuit of each determining sub-circuit determines that the received detection result is the same as a preset result, determining a normal engagement state between the first pins and the second pins; and when the judging circuit of any one determining sub-circuit determines that the received detection result is different from the preset result, determining an abnormal engagement state between the first pins and the second pins, and issuing an alarm signal.

11. The method according to claim 7, wherein the determining circuit is connected with a plurality of secondary pins, and the determining circuit comprises a transistor, a detecting circuit, a judging circuit, and a plurality of resistors corresponding one-to-one to the secondary pins; and
the determining, by the at least one secondary pin, of the connector, located in the extension direction of the first pin, and the determining circuit, on the substrate, connected with the secondary pin or pins, the engagement state between the first pins and the second pins comprises:
outputting a first voltage on a backlight wire of the substrate to control the transistor to be turned on;
outputting a second voltage to a source of the transistor on another wire on the substrate than the backlight wire;
outputting, by the first pin with the secondary pin in the extension direction of said first pin, a third voltage;
detecting, by the detecting circuit, a current or a voltage at a detection node, and feeding a detection result back to the judging circuit; and
when the judging circuit determines that the received detection result is the same as a preset result, determining a normal engagement state between the first pins and the second pins; and when the judging circuit determines that the received detection result is different from the preset result, determining an abnormal engagement state between the first pins and the second pins, and issuing an alarm signal.

12. The method according to claim 9, wherein after the normal engagement state between the first pins and the second pins is determined, the method further comprises:
stopping the first pin with the secondary pin in the extension direction of said first pin from outputting the third voltage; and
outputting a fourth voltage on the backlight wire to control the transistor to be turned off.

13. The method according to claim 9, wherein after the abnormal engagement state between the first pins and the second pins is determined, the method further comprises:
determining an engagement state between the first pins and the second pins, both of which are engaged again.

14. A display device, comprising the printed circuit board according to claim 1 and a flexible printed circuit connected with the printed circuit board.

* * * * *